United States Patent
Fujita

(10) Patent No.: US 7,224,940 B2
(45) Date of Patent: May 29, 2007

(54) FREQUENCY MODULATING DEVICE OF AN INTEGRATED CIRCUIT AND A METHOD OF MEASURING MODULATED FREQUENCY

(75) Inventor: Ken Fujita, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 194 days.

(21) Appl. No.: 10/444,130

(22) Filed: May 23, 2003

(65) Prior Publication Data
US 2004/0077328 A1    Apr. 22, 2004

(30) Foreign Application Priority Data
Oct. 22, 2002    (JP) .............. 2002-306485

(51) Int. Cl.
*H04B 17/00* (2006.01)
(52) U.S. Cl. ............... 455/67.11; 455/67.14; 455/226.4
(58) Field of Classification Search .......... 455/115.1, 455/67.11, 67.14, 226.1, 323, 84, 86, 226.4; 716/4
See application file for complete search history.

(56) References Cited

U.S. PATENT DOCUMENTS

| | | | |
|---|---|---|---|
| 6,259,314 B1 * | 7/2001 | Liu et al. .............. | 329/304 |
| 6,816,559 B1 * | 11/2004 | Sirito-Olivier et al. ..... | 375/344 |
| 6,882,827 B1 * | 4/2005 | Collier .................... | 455/67.11 |
| 2004/0148580 A1 * | 7/2004 | de Obaldia et al. ......... | 716/4 |

FOREIGN PATENT DOCUMENTS

| | | |
|---|---|---|
| JP | 62-186073 | 11/1987 |
| JP | 5-28973 | 4/1993 |
| JP | 2000-131359 | 5/2000 |

* cited by examiner

*Primary Examiner*—Edward F. Urban
*Assistant Examiner*—Blane J. Jackson
(74) *Attorney, Agent, or Firm*—Rabin & Berdo, PC

(57) ABSTRACT

A frequency modulating device includes a frequency generator for generating a frequency-modulated, first carrier and an input terminal to which a non-modulated second carrier is input. An amplifier amplifies the second carrier. A frequency converter receives the first and second carriers for producing an intermediate frequency signal and feeds the intermediate frequency signal to an output terminal. A band-pass filter limits the frequency band of the intermediate frequency signal to output a band-limited signal. A calculator calculates the spectrum distribution of the band-limited signal. The frequency generator, input terminal, amplifier, frequency converter and output terminal are included in a semiconductor device constructed on a semiconductor wafer in the form of integrated circuit.

13 Claims, 9 Drawing Sheets

FREQUENCY MODULATING DEVICE OF AN INTEGRATED CIRCUIT AND A METHOD OF MEASURING MODULATED FREQUENCY

BACKGROUND OF THE INVENTION

1. Field of the Invention

The present invention relates to a frequency modulating device feasible for, e.g. the modulation of radio frequency, and a modulated frequency measuring method feasible for, e.g. the adjustment of a modulation frequency to be set in the frequency modulating device.

2. Description of the Background Art

Generally, a frequency modulating circuit includes a frequency divider, a first and a second band-pass filter, a first and a second frequency-to-voltage converter or detector, and a controller, as taught in, e.g. Japanese patent laid-open publication No. 2000-131359. In the frequency modulating circuit, a signal modulated by a frequency modulator is fed to the frequency divider on a branch path. The frequency divider divides the frequency of the input signal by a number N and delivers the resulting signal to the first and second band-pass filters.

The first band-pass filter divides a frequency equal to the central frequency of its pass band by N, i.e. frequency/N, to output it as a carrier frequency for a frequency modulated signal. The second band-pass filter passes only the frequency of a modulated wave (first sideband) appearing around the frequency which is equal to 1/N of the carrier frequency.

The outputs of the first and second band-pass filters are input to the first and second frequency-to-voltage converters, respectively. The first frequency-to-voltage converter converts the amplitude of the input carrier to a corresponding DC voltage and feeds the DC voltage to the controller. Likewise, the second frequency-to-voltage converter outputs a DC voltage corresponding to the amplitude of the input modulated wave and feeds the DC voltage to the controller. The controller produces a modulation index from a ratio between the two input voltage signals and generates a control signal such that the modulation index coincides with a number equal to 1/N of a preselected value. The first and second band-pass filters, first and second frequency-to-voltage converters and controller are the major components that contribute to the measurement of a modulation factor.

The two output voltage signals mentioned above are respectively proportional to the carrier frequency not subjected to frequency division and the modulation wave frequency not subjected to frequency division. A modulated frequency can be produced from a difference between the two output voltage signals. The frequency modulating circuit therefore compares the difference between the voltage signals with a preselected reference voltage for thereby adjusting the modulation frequency.

The conventional frequency modulating circuit has the following problems left unsolved. Generally, when the circuit is integrated into a semiconductor device, the first and second band-pass filters occupy a substantial area each on a semiconductor chip, making it difficult to reduce the total area to be allocated to the circuit by integration. However, when priority is given to circuit integration and the reduction of the total area, a circuit for the measurement of a modulation factor may not be integrated but excluded from the frequency modulating circuit integrated on the chip. This successfully reduces the total area to be occupied by the frequency modulating circuit on the chip.

However, measuring with a conventional tester a modulation factor of a frequency modulating circuit integrated on a semiconductor wafer including no measuring circuit is far higher in cost than measuring it with a measuring circuit included in the frequency modulating circuit. This is particularly true when it comes to a radio circuit that directly deals with a high-frequency signal. More specifically, a transmitter system included in a radio circuit is usually used to measure a modulated frequency and sends its output to a spectrum analyzer, allowing the spectrum analyzer to directly measure a modulated frequency. When a high-frequency signal is measured on the wafer including no measuring circuit, the entire route extending from a contact pad provided in the integrated circuit to a tester via a probe and a probe card must be provided with a special measure for protecting a high-frequency signal against disturbance or noise. Such a measuring system needs disproportionate costs.

SUMMARY OF THE INVENTION

It is an object of the present invention to provide a frequency modulating device capable of measuring a modulated frequency without resorting to an exclusive measuring system including a special measure for protecting a high-frequency signal, and preserving competitive power in cost as a semiconductor product.

It is also an object of the present invention to provide a method measuring a modulated frequency without resorting to an exclusive measuring system including a special measure for protecting a high-frequency signal, and preserving competitive power in cost as a semiconductor product.

In accordance with the present invention, a frequency modulating device includes a frequency generator for generating a frequency-modulated, first carrier and an input terminal to which a non-modulated, second carrier is input. An amplifier amplifies the second carrier. A frequency converter receives the first and second carriers for producing an intermediate frequency signal and feeds it to an output terminal. A band-pass filter limits the frequency band of the intermediate frequency signal to output a band-limited signal. A calculator calculates the spectrum distribution of the band-limited signal. The frequency generator, input terminal, amplifier, frequency converter and output terminal are included in a semiconductor device constructed on a semiconductor wafer in the form of integrated circuit.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
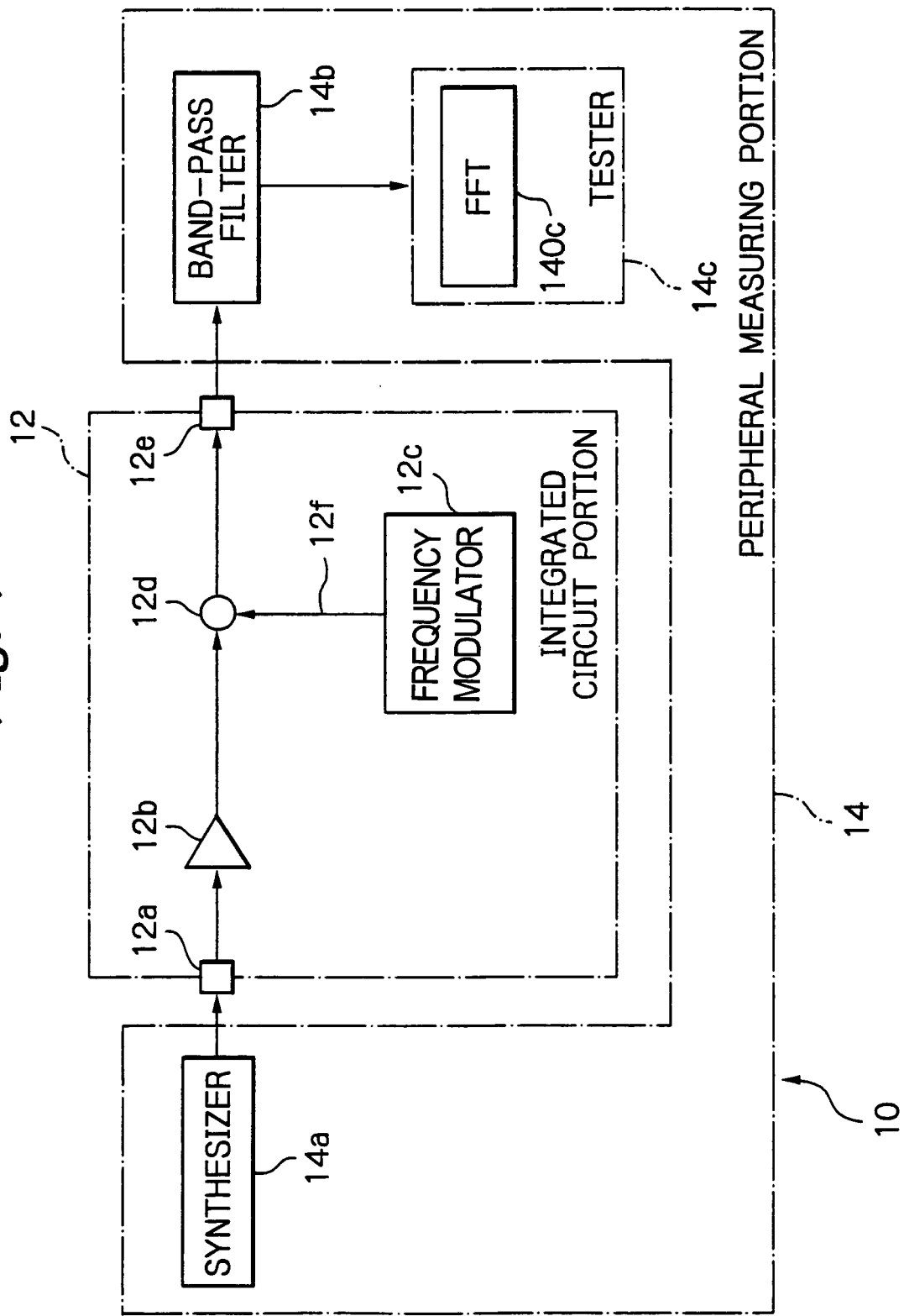
FIG. 1 is a schematic block diagram showing an embodiment of a frequency modulating device in accordance with the present invention.

Referring to FIG. 1 of the accompanying drawings, frequency modulating circuitry 10 in accordance with the invention is generally made up of an integrated circuit portion 12 formed on a semiconductor wafer, not shown, and a peripheral measuring portion 14 arranged outside of the integrated circuit portion 12. The integrated circuit portion 12 is implemented as a semiconductor device including the transmitter and receiver systems of radio circuitry. The integrated circuit portion 12 includes an input contact pad 12a, an amplifier 12b, a frequency modulator 12c, a frequency converter 12d, and an output contact pad 12e interconnected as illustrated. A high frequency, or second carrier $f_{c2}$, is input to the integrated circuit portion 12 from the outside via the input pad 12a. The amplifier 12b is included in the receiver system and is adapted to amplify the input high-frequency signal $f_{c2}$. It is known that the amplification of an input signal has influence on the accuracy of the result of measurement, as will be described later specifically. The high-frequency signal $f_{c2}$ thus amplified by the amplifier 12b is delivered to the frequency converter 12d. Portions of the frequency modulating circuitry 10 not relevant to the understanding of the present invention are not shown in the figures nor will be described. In the following description, signals are designated by reference numerals attached to connections on which they appear.

Figure 2:
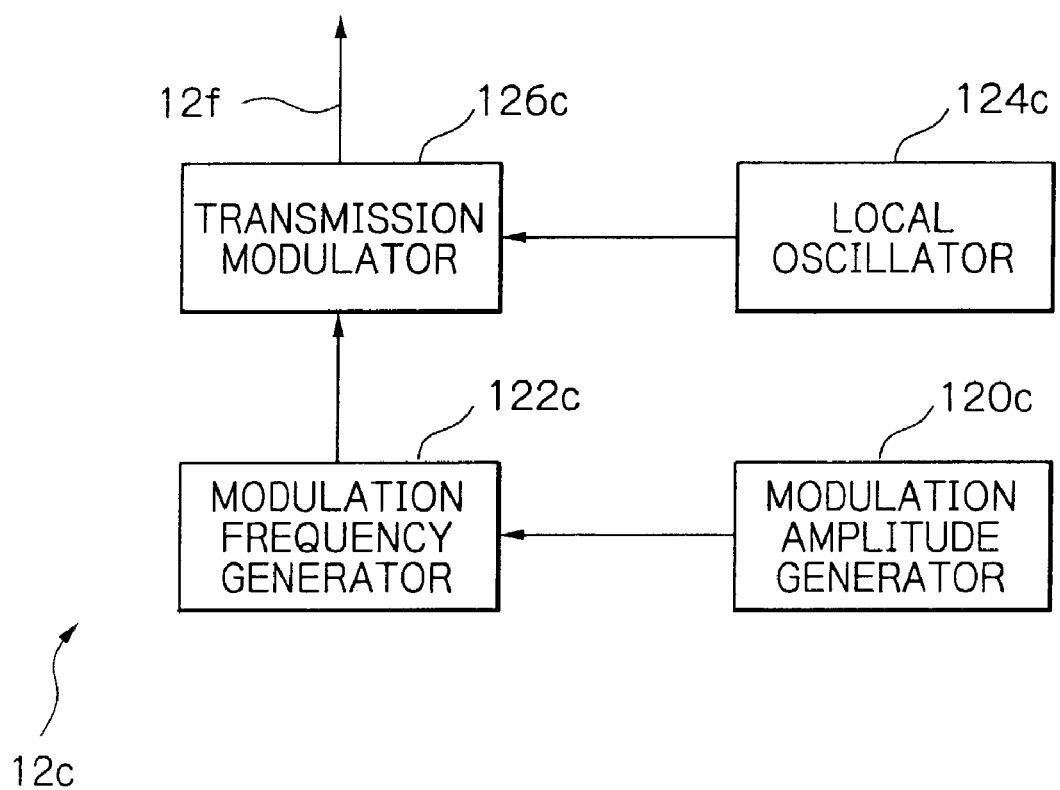
FIG. 2 is a schematic block diagram showing a specific configuration of a frequency modulator included in the illustrative embodiment.

The frequency modulator 12c is included in the transmitter system of the integrated circuit portion 12 and generates a local input frequency or first carrier $f_{c1}+f_s$. The frequency modulator 12c can therefore be characterized as a frequency generator. FIG. 2 shows a specific configuration of the frequency modulator 12c. The frequency modulator 12c is made up of a modulation amplitude generator 120c, a modulation frequency generator 122c, a local oscillator 124c, and a transmission modulator 126c interconnected as shown. The modulation amplitude generator 120c is adapted to generate an AC amplitude for determining a modulation frequency. To the modulation amplitude generator 120c, a switching control signal is applied for generating a voltage control signal in the form of AC amplitude, as will be described specifically later. The modulation amplitude generator 120c produces its output voltage changeable in response to the switching control signal.

The modulation frequency generator 122c is adapted to generate a modulation frequency $f_s$ in response to the AC amplitude output from the modulation amplitude generator 120c and feeds the modulation frequency $f_s$ to the transmission modulator 126c. The local oscillator 124c is adapted to generate, e.g. a predetermined frequency signal. More specifically, the local oscillator 124c outputs a preselected local oscillation signal $f_{c1}$ in response to a preselected voltage signal applied thereto at the time of power-up of the circuits and feeds the local oscillation signal $f_{c1}$ to the transmission modulator 126c. It is to be noted that a PLL (Phase Locked Loop) circuit may be used to generate a plurality of different oscillation signals.

The transmission modulator 126c is adapted for combining, or adding, the local oscillation frequency $f_{c1}$ to the modulation frequency signal $f_s$ proportional to the AC amplitude. The transmission modulator 126c feeds the frequency converter 12d, FIG. 1, with the resulting frequency $f_{c1}+f_s$ as a local input frequency 12f, i.e. the first carrier mentioned earlier.

Referring again to FIG. 1, the frequency converter 12d, which is also included in the receiver system, is adapted for generating an intermediate frequency. More specifically, in the illustrative embodiment, the high-frequency signal $f_{c2}$ is input to the frequency converter 12d as a received signal. The frequency converter 12d produces a difference of the above high-frequency signal $f_{c2}$ from the local input frequency 12f, i.e. $f_{c2}-(f_{c1}+f_s)$, as an intermediate frequency and delivers the intermediate frequency to the output pad 12e. The frequency of the high-frequency signal $f_{c2}$ is dependent on the characteristics of the frequency converter 12d. In the illustrative embodiment, the frequency $f_{c2}$ is made identical with the local oscillation frequency $f_{c1}$. Consequently, the modulation frequency $f_s$ is output via the output pad 12e as a frequency difference. This makes it needless to deal with the high-frequency signal $f_{c2}$.

The output pad 12e, like the input pad 12a, has its shape configured such that a probe is accessible to contact it during measurement on the wafer.

The peripheral measuring portion 14 includes a synthesizer 14a, a band-pass filter 14b, and a tester 14c interconnected as illustrated. The synthesizer 14a is adapted to generate and output a signal matching with a desired frequency and implementing the high-frequency signal $f_{c2}$ stated earlier.

The band-pass filter 14b comprises a low-pass filter and has a digital sampling function as well. Measurement accuracy is more enhanced as the time interval of digital sampling is made sufficiently shorter than the reciprocal of a modulation frequency, i.e. as the digital sampling rate becomes higher. For example, the digital sampling interval should preferably be 1 μs for a modulation frequency of 160 kHz. The number of sampling points may be the power of 2, so that FFT (Fast Fourier Transform), following thereto, can be easily effected. The FFT is effected after the digitization of the output of the band-pass filter 14b.

The tester 14c includes an FFT circuit 140c and is adapted to measure the power distribution of the input digital signal with respect to frequency or the amplitudes of the individual frequency components of the digital signal.

As stated above, for the measurement of frequency modulation, the illustrative embodiment uses the devices available in the integrated circuit portion 12 without including an exclusive circuit dedicated for dealing with the high-frequency signal in the integrated circuit portion 12. More specifically, the devices for measurement which would otherwise occupy a substantial area on the wafer are arranged outside of the integrated circuit portion 12. This successfully reduces the area to be allocated to the peripheral measuring circuit 14 while facilitating measurement with the conventional configuration.

Figure 3:
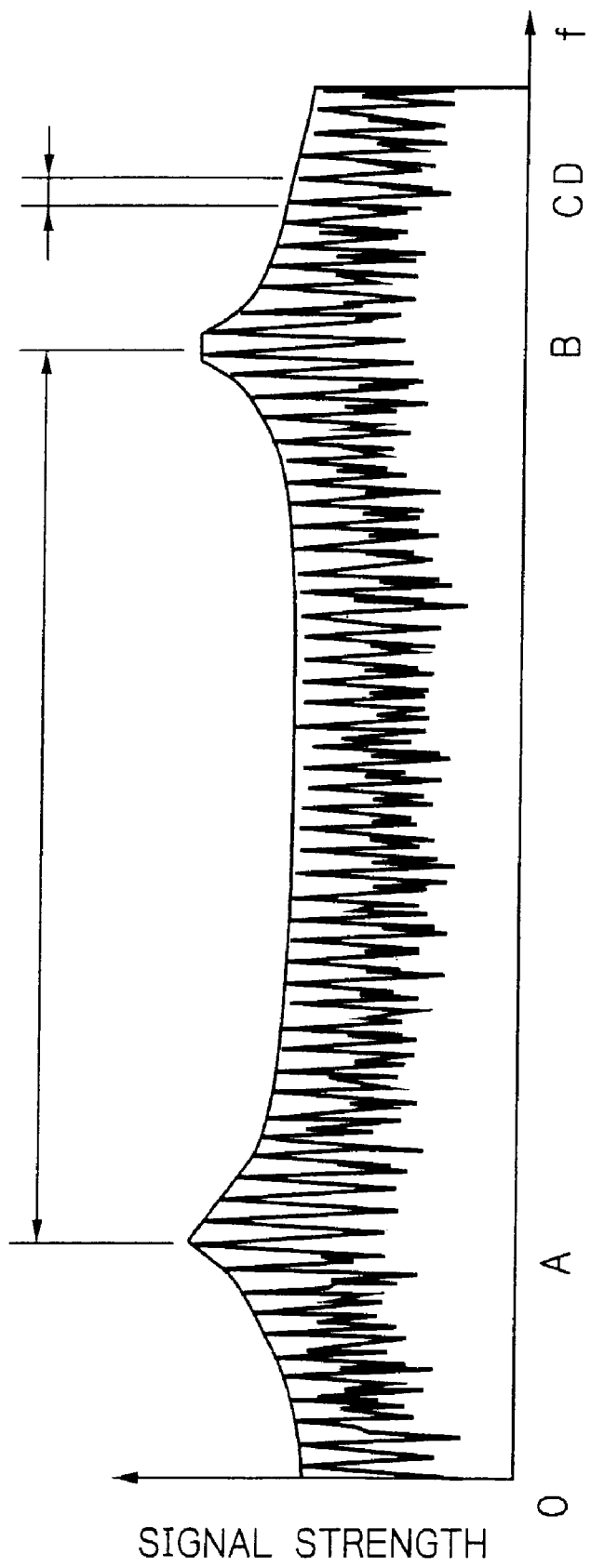
FIG. 3 shows a specific spectrum distribution of a modulated frequency particular to the illustrative embodiment.

A specific procedure will be described hereinafter for frequency modulation measurement available with the illustrative embodiment. FIG. 3 shows a specific spectrum distribution in which two peaks of the envelope respectively correspond to a negative frequency of $A=f_{c2}-f_{c1}-f_s$ and a positive frequency of $B=f_{c2}-f_{c1}+f_s$ included in a modulated signal. It will therefore be seen that a difference between the frequencies A and B, i.e. A−B, is $2f_s$. Also, a difference between peaks C and D, D−C, is representative of the reciprocal of a measuring period of time over which the spectrum is measured, i.e. frequency resolution for measurement.

Modulation frequencies $f_s$ of +160 kHz and −160 kHz are alternately combined with the local oscillation frequency $f_{c1}$ of 2,432 MHz, which is included in the local input frequency 12f, for 64 −s each. The accuracy of modulated frequency increases in inverse proportion to the period of time over which frequency modulation is effected, as stated earlier.

Figure 4:
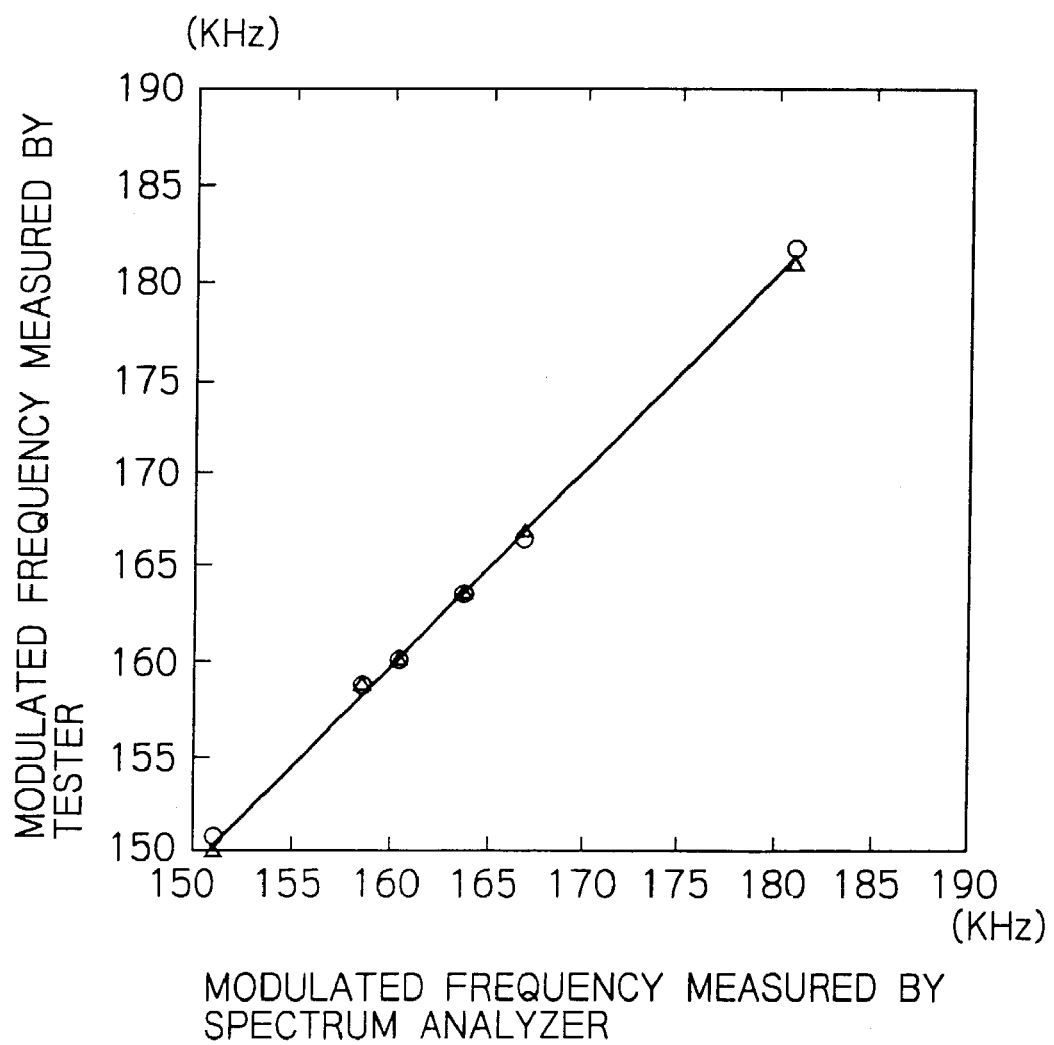
FIG. 4 is a graph useful for comparatively understanding the illustrative embodiment with a conventional spectrum analyzer with respect to a modulated frequency measured.

Reference will be made to FIG. 4 for describing how accurate the measurement of the illustrative embodiment is. In FIG. 4, the ordinate and abscissa respectively indicate modulated frequencies measured by the tester 14c of the illustrative embodiment and modulated frequencies directly measured by a spectrum analyzer. Circles and triangles shown in FIG. 4 are representative of two cases in which modulated frequencies were measured with respect to different input signal strengths. As shown, the modulated frequencies measured by the tester 14c satisfy substantially a linear relation with those measured by the spectrum analyzer, proving that the measurement of the illustrative embodiment is effective. The measurement accuracy achievable with the illustrative embodiment is ±2 kHz and is preserved even when the input signal strength slightly varies.

Figure 5:
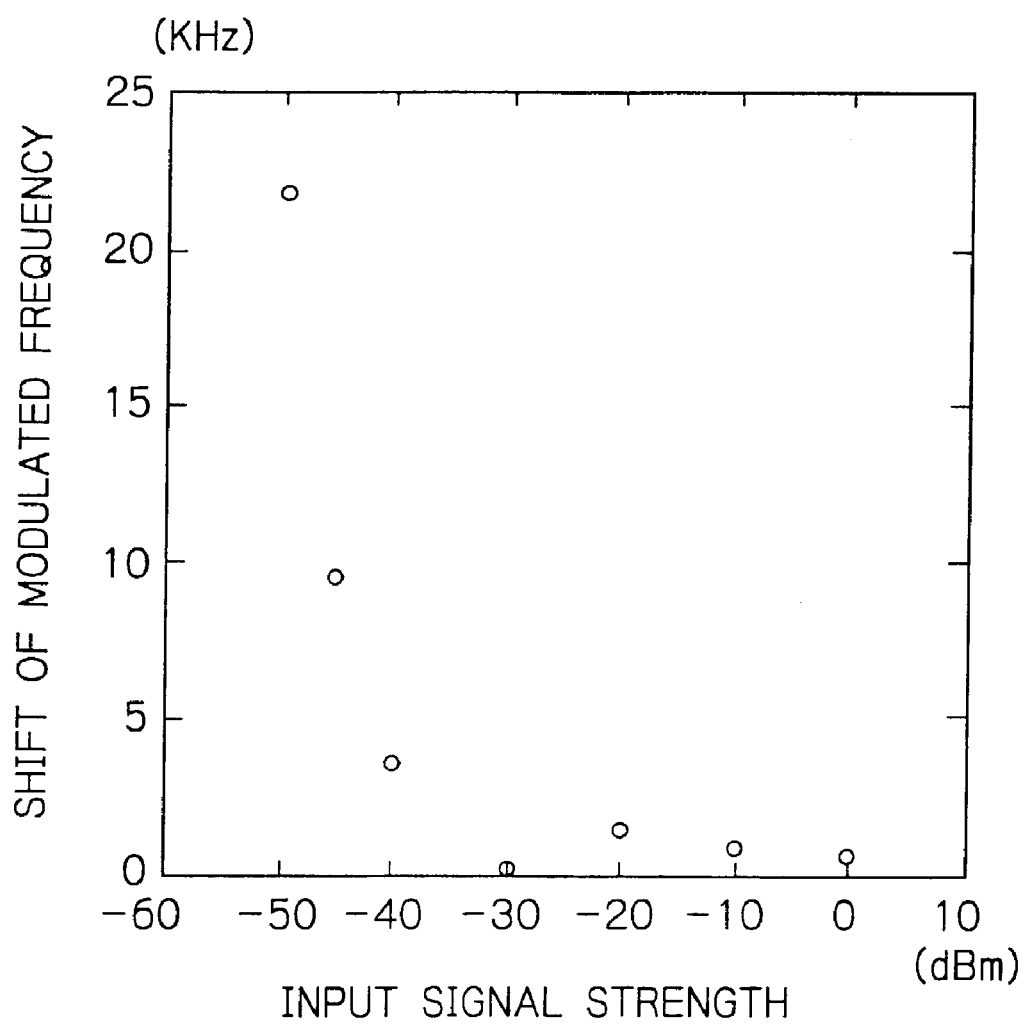
FIG. 5 plots the measured accuracy of a modulated frequency with respect to the strength of an input signal achievable with the illustrative embodiment.

FIG. 5 plots deviations of the modulated frequencies measured by the tester 14c from those measured by the spectrum analyzer with respect to the input signal strength represented by the power of the high-frequency signal $f_{c2}$ input to the receiver system. As FIG. 5 indicates, the measurement accuracy of ±2 kHz is achievable if the input power is equal to or above 1 μW, or −30 dBm. Generally, the synthesizer 14a for outputting the high-frequency signal $f_{c2}$ is capable of producing an output signal of 1 mW or above. Although the attenuation of the signal is not negligible on the path from the synthesizer 14a to the input pad 12a of the integrated circuit portion 12, the synthesizer 14a can surely feed power of 1 μW or above to the receiver system of the integrated circuit portion 12. It is therefore possible to insure the measurement accuracy of the illustrative embodiment stated above.

Figure 6:
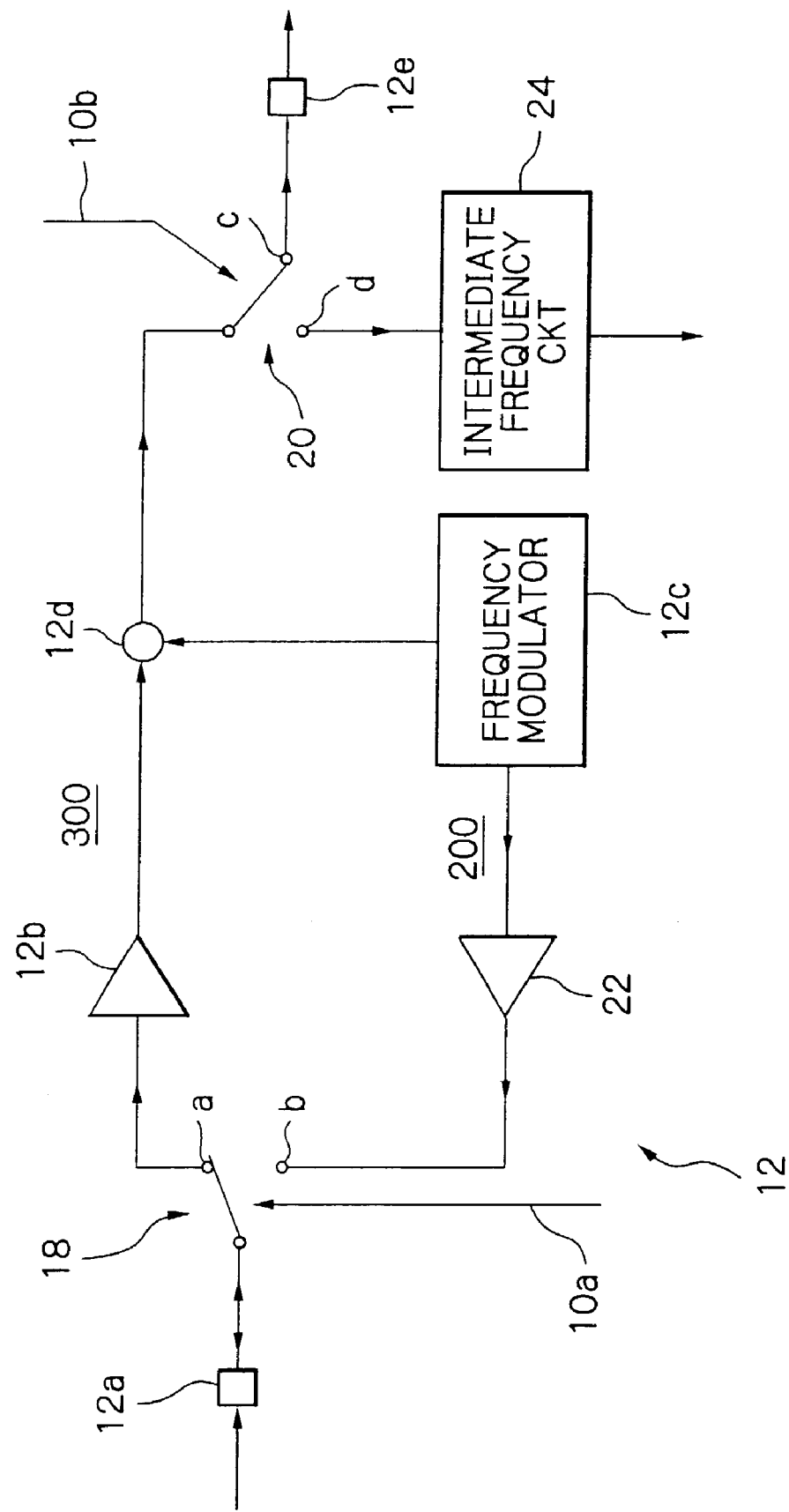
FIG. 6 is a schematic block diagram showing a specific configuration of an integrated circuit portion included in the illustrative embodiment, which is applied to a radio apparatus by way of example.

The illustrative embodiment can therefore measure modulated frequencies by effectively using the limited area available on a semiconductor wafer, i.e. without resorting to an exclusive measuring circuit on the wafer. This can be done if the modulated local input frequency 12f is fed from the transmitter system 200 to the frequency converter 12d of the receiver system 300, converted to an intermediate frequency, output from the integrated circuit portion 12, and then measured as shown in FIG. 6. Further, because the exclusive measuring circuit is not necessary, the illustrative embodiment reduces test cost. Moreover, the measuring method of the illustrative embodiment is desirable even when frequency modulation is measured or adjusted after the assembly of a semiconductor device chip, as distinguished from measurement on a wafer.

FIG. 6 shows a specific configuration of the integrated circuit portion 12 available when the frequency modulating circuitry 10 is applied to a radio apparatus. In FIG. 6, structural elements like those shown in FIGS. 1 and 2 are designated by identical reference numerals and will not be described specifically in order to avoid redundancy. In the following description, the input and output contact pads 12a and 12e will be referred to as antenna and measurement terminals, respectively. The antenna terminal 12a and measurement terminal 12e should only be configured such that the probes of a measuring device can contact them during measurement. More specifically, the two terminals 12a and 12e do not have to be connected to external, separate terminals in an application in which the integrated circuit portion 12 is fabricated with resin.

As shown in FIG. 6, the integrated circuit portion 12 includes an antenna switch 18, a local oscillation switch 128c (see FIG. 7 also), and an intermediate frequency switch 20. The antenna switch 18 is connected to switch the source and destination of a signal in accordance with the transmit/receive mode of the radio apparatus indicated by a switching control signal 10a, which is fed from a system controller not shown. More specifically, the antenna switch 18 selects its terminal a in the event of modulation frequency measurement or its terminal b in the event of transmission. To the terminal b, applied is the output of the amplifier 22 included in the transmitter system 200.

The intermediate frequency switch 20 is adapted to select a particular destination in accordance with modulation frequency measurement or receipt, as indicated by a control signal 10b, which is also output from the system controller. More specifically, the intermediate frequency switch 20 selects a terminal c in the event of modulation frequency measurement or a terminal d in the event of receipt. When the terminal d is selected, the intermediate frequency is input to an intermediate frequency circuit 24.

Figure 7:
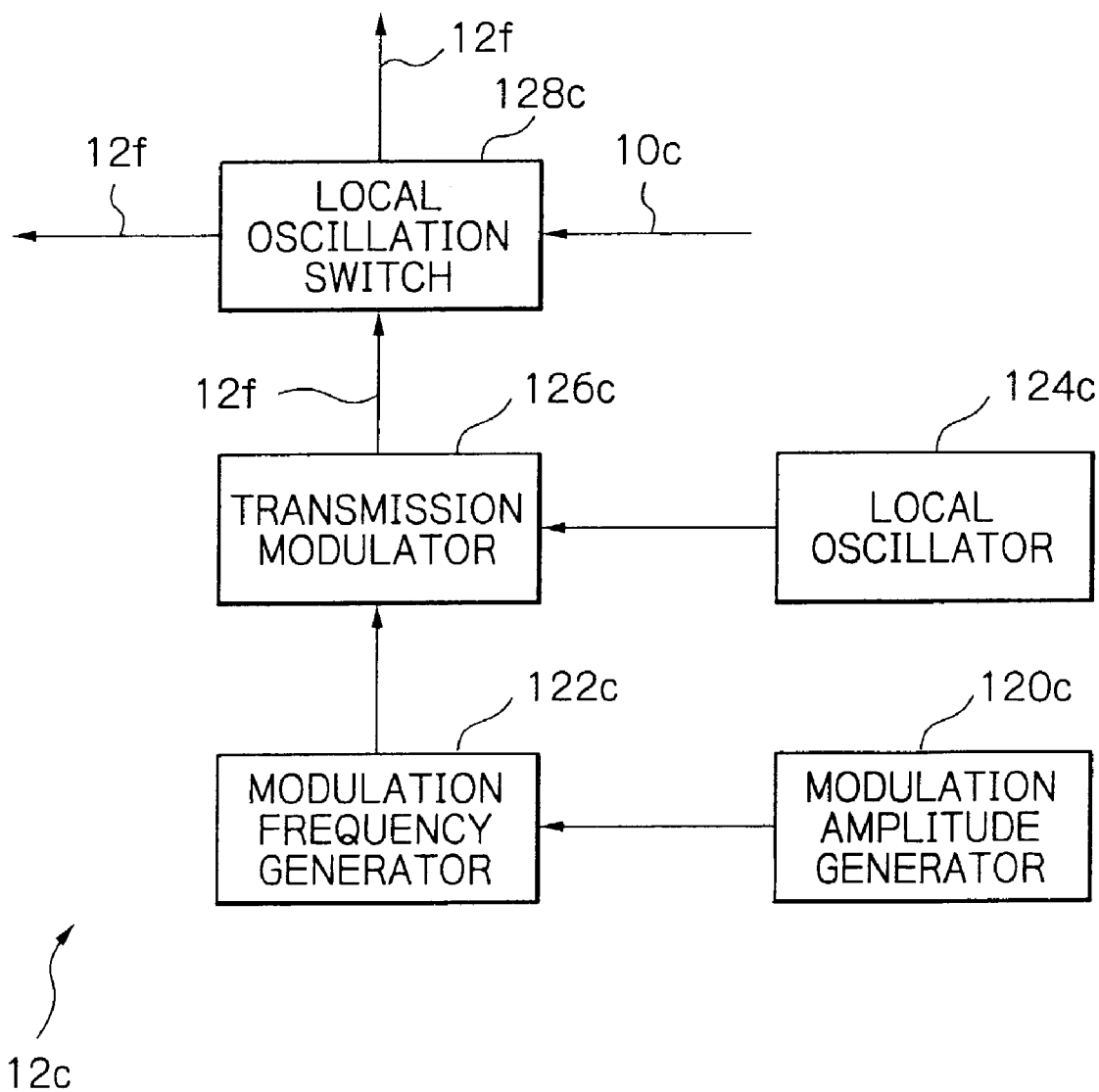
FIG. 7 is a schematic block diagram schematically showing a frequency modulator included in the configuration of FIG. 6.

FIG. 7 shows a specific configuration of the frequency modulator 12c included in the circuitry of FIG. 6. As shown, the local oscillation switch 128c is connected to a transmission modulator 126c and the frequency converter 12d, FIG. 1, and operated in response to a control signal 10c, which is output from the system controller in the event of measurement. More specifically, the local oscillation switch 128c is adapted to select the frequency converter 12d in the event of modulation frequency measurement, so that the local input frequency 12f with the frequency $f_{c1}+f_s$ is fed to the frequency converter 12d. When measurement is not effected, the local oscillation switch 128c transfers the output of the frequency modulator 12c to the amplifier 22 included in the transmitter system.

Figure 8:
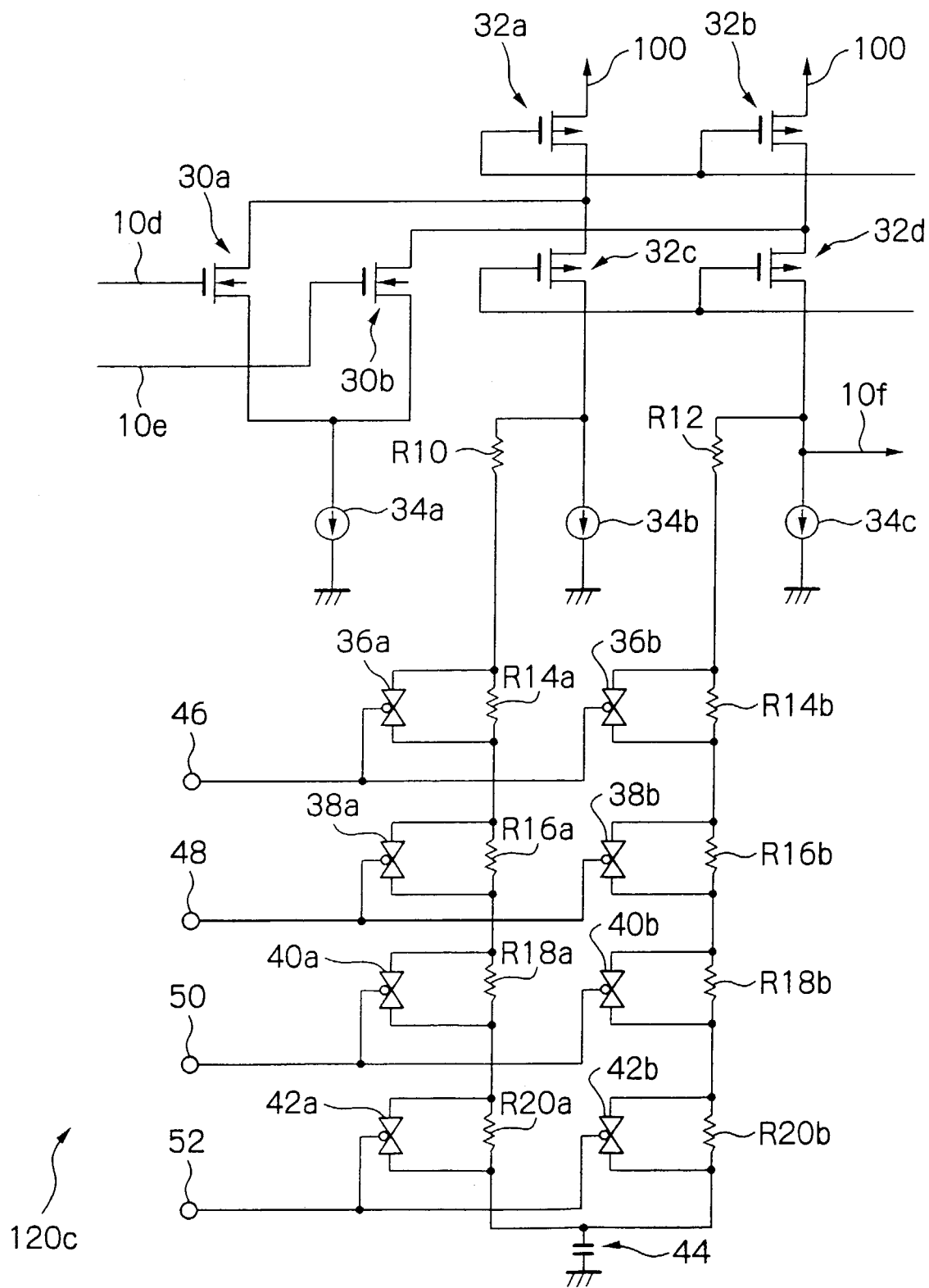
FIG. 8 is a schematic circuit diagram showing a specific configuration of a modulation amplitude generator included in the configuration of FIG. 7.

FIG. 8 shows a specific configuration of the modulation amplitude generator 120c. The modulation amplitude generator 120c includes n-type FETs (Field Effect Transistors) 30a and 30b, p-type FETs 32a, 32b, 32c and 32d, constant-current sources 34a, 34b and 34c, ten resistors R10, R12, R14a, R14b, R16a, R16b, R18a, R18b, R20a and R20b, analog switches 36a, 36b, 38a, 38b, 40a, 40b, 42a and 42b, and a capacitor 44 interconnected as shown. The modulation amplitude generator 120c may be adjusted by trimming the elements formed on the semiconductor wafer or setting data in a register on the wafer to establish the function of converting differential signals 10d and 10e input thereto to a single-phase AC signal to output the latter in the form of single phase of AC amplitude 10f.

More specifically, the differential signals 10d and 10e are input to the gate electrodes of the n-type FETs 30a and 30b, respectively. The FETs 30a and 30b have drain electrodes thereof connected to the drain electrodes of the p-type FETs 32a and 32b, respectively. The FETs 30a and 30b have source electrodes thereof connected together and grounded via the constant-current source 34a.

The p-type FETs 32a and 32b have drain electrodes thereof connected to the source electrodes of the p-type FETs 32c and 32d, respectively. Also, the FETs 32a and 32b have source electrodes thereof connected to a common power supply line 100 and supplied with a power supply voltage thereby. The p-type FET 32c has its drain electrode connected to the series connection of resistors R10, R14a, R16a, R18a and R20a and to a constant-current power supply 34b. Likewise, the p-type FET 32d has its drain electrode connected to the series connection of resistors R12, R14b, R16b, R18b and R20b and to a constant-current power supply 34c. The serially connected resistors R20a and R20b have ends thereof grounded via the capacitor 44.

Each of the analog switches 36a through 42b is connected in parallel to different one of the eight resistors R14a through R42b, and has its conductive resistance of 300 Ω. In the illustrative embodiment, the resistors R10 and R12 have the resistance of 2 kΩ while the resistors R14a and R14b have the resistance of 115 Ω. Each of the resistors R16a, R18a and R20a is equal in resistance to corresponding one of the resisters R16b, R18b and R20b connected in pair. The three different resistances R16a, R18a, R20a, or R16b, R18b, R20b of the pairs of resistors are so selected as to differ from the resistances of the associated analog switches 38a, 40a, 42a, or 38b, 40b, 42b in the ON/OFF states thereof to take the ratios substantially equal to 2:4:8. In the illustrative embodiment, the resistors R16a and R16b, resistors R18a and R18b and resistors R20a and R20b have resistances of 200 Ω, 400 Ω and 800 Ω, respectively.

The modulation amplitude generator 120c converts currents flowing through the above-described resistors to corresponding voltages and selectively outputs them as the AC amplitude 10f. Stated another way, the modulation amplitude generator 120c varies the resistance in response to the currents to thereby vary the voltage to be input to the modulation frequency generator 122c, FIG. 7. The modulation frequency generator 122c adjusts the modulation frequency with the AC amplitude 10f.

Referring again to FIG. 6, operation will be described on the frequency modulating circuitry 10. In the event of modulation frequency measurement, the antenna switch 18 is connected to its terminal a while the intermediate frequency switch 20 is connected to its terminal c. In addition, the local oscillation switch 128c, FIG. 7, is selected to feed the local input frequency 12f to the frequency converter 12d. The synthesizer 14a, FIG. 1, inputs, e.g. a continuous, non-modulated high-frequency signal $f_{c2}$ to the integrated circuit portion 12 on the antenna terminal 12a. When the high-frequency signal $f_{c2}$ is input via a probe, a substantial power loss may be incurred in the high-frequency signal. However, sufficient measurement accuracy is achievable so long as the power of the high-frequency signal is 1 μW or above, as stated earlier. The high-frequency signal $f_{c2}$ is input to the frequency converter 12d via the amplifier 12b included in the receiver system.

The frequency converter 12d uses the high-frequency signal fc2 and the modulated local input frequency 12f $(f_{c1}+f_s)$, which is input from the frequency modulator 12c, to produce a sum frequency, $f_{c2+(fc1}+f_s)$, and a difference frequency, $f_{c2}- (f_{c1}+f_s)$, as intermediate frequencies. These intermediate frequencies are fed to the band-pass filter 14b, FIG. 1, via the measurement terminal 12e.

The band-pass filer 14b transfers only the difference frequency, $f_{c2}- (f_{c1}+f_s)$, to the tester 14c in the form of digital signal. The frequencies $f_{c1}$ and $f_{c2}$ are identical with each other. In the tester 14c, the FFT 140c executes the FFT transform with the digital signal and causes the resulting frequency distribution to be displayed for modulation frequency measurement.

When the modulated frequency measured differs from a preselected value, as sometimes occurs, the four pairs of analog switches 36a and 36b, 38a and 38b, 40a and 40b and 42a and 42b shown in FIG. 8, are controlled to represent the corresponding bits. More specifically, by controlling the four bits representing binary "0000" through "1111", it is possible to vary the modulation frequency to sixteen different values. In the illustrative embodiment, the analog switches 36a through 42b all are the type of active "low".

Figure 9:
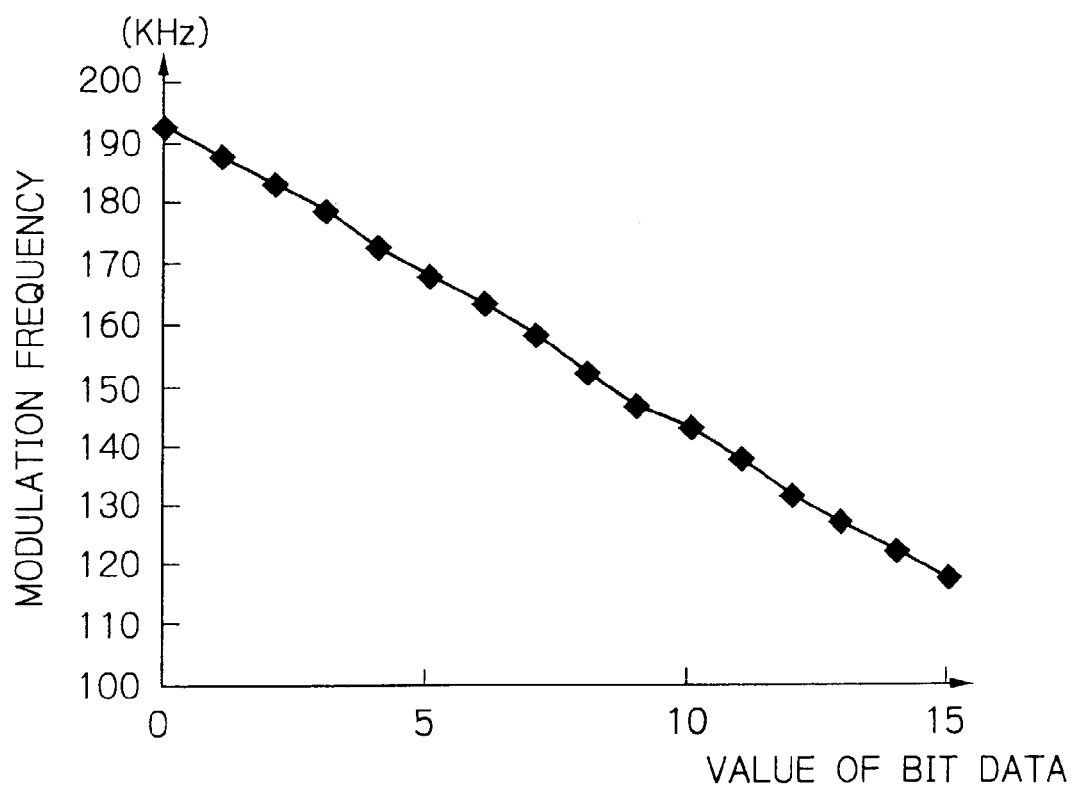
FIG. 9 plots a modulated frequency with respect to trimming data fed in the modulation amplitude generator of FIG. 7.

As shown in FIG. 9, when sixteen different voltages are selectively fed as trimming data, a particular modulation frequency is derived from the trimming data. As FIG. 9 indicates, the modulation frequency linearly varies with respect to the trimming data. For example, assuming that the modulation frequency for the trimming data "1000", i.e. decimal "8", is a reference, then the modulation frequency can be adjusted if increased by about 25% when the trimming data is binary "0000", i.e. decimal "0", or if reduced by about 20% when the trimming data is binary "1111", i.e. decimal "15".

Control terminals 46, 48, 50 and 52 shown in FIG. 8 are provided to receive bit data for controlling the analog switches 36a through 42b to be enabled or disabled. The control terminals 46 through 52 may be connected to the power supply line of the circuitry via current fuses not shown. In such a case, after having measured the modulated frequency, appropriate one or ones of the fuses may be cut off by current trimming, laser trimming or similar technology. Alternatively, a nonvolatile storage circuit may be built in the integrated circuit portion 12 so as to store the trimming data after the circuit portion 12 has been sealed with resin, in which case the trimming data will later be used to control the analog switches to there by confirm modulation frequency.

As stated above, the radio apparatus is additionally provided with at least the intermediate frequency switch 20 to which the output of the frequency converter 12d is input and local oscillation switch 128c configured to select the destination of the local input frequency 12f. It is therefore possible to control the switches 20 and 128c to execute modulated frequency measurement.

While the foregoing description has concentrated on the measurement of modulated frequency, the oscillation frequency of the local oscillator 124c can be measured if the modulation frequency generator 122c is deactivated.

Further, after the integrated circuit portion 12 with the nonvolatile memory has been constructed into a module together with other integrated circuits, the trimming data may be written into the memory, so that the trimming data can be read out to control the analog switches later.

As stated above, the illustrative embodiment reduces the total area to be allocated to the circuitry on a wafer and measures modulated frequency without resorting to an exclusive measuring device or tester configured to deal with a high-frequency signal. This obviates both of an increase in area otherwise ascribable to the integration of the entire circuitry necessary for measurement and an increase in cost otherwise ascribable to the measuring or testing circuit to which an exclusive area is not allocated to thereby reduce the size and cost of the frequency measuring device.

More specifically, at least the intermediate frequency switch for transferring the output of the frequency converter and the local oscillation switch for selecting the destination of the local input frequency are added to the frequency modulating device. Those switches are controlled to selectively execute modulated frequency measurement.

Trimming data are stored for feeding an AC amplitude in accordance with a modulated frequency measured. When the trimming data is read out to control the analog switches, the modulated frequency can easily be checked.

Further, modulated frequency measurement and adjustment can be effected on a semiconductor wafer or after the assembling of a chip, resulting in a minimum number of circuit elements required for measuring a modulated frequency in the frequency modulator apparatus. This solves the circuit area and cost problems at the same time and promotes easy measurement and adjustment.

In summary, a frequency modulating device of the present invention includes a frequency generator, an input terminal, an amplifier, a frequency converter and an output terminal implemented as a semiconductor device originally constructed on a semiconductor wafer and capable of dealing with a high frequency. The frequency modulating device therefore minimizes the total area of the semiconductor device. A first carrier generated in the semiconductor device and a second carrier fed via the input terminal are input to the frequency converter to thereby generate an intermediate frequency signal. A second carrier source, a frequency filter and an operation circuit are arranged outside of the semiconductor device in order to measure a modulated signal.

With the above-described configuration, it is possible to settle a dilemmatic situation in which the integration of the entire circuitry necessary for modulated frequency measurement results in an increase in area to occupy, but an exclusive area assigned to a measuring system configured to deal with a high-frequency signal results in an increase in cost.

A measuring method for the above-described frequency modulating device of the present invention generates the first and second carriers in the semiconductor device, produces an intermediate frequency from the two carriers, and then executes processing with elements originally present in the semiconductor device. The intermediate frequency can therefore be determined without resorting to any extra measure against a high-frequency signal. After the band restriction of the intermediate frequency has been established outside of the semiconductor device, a spectrum distribution is calculated with the band-limited intermediate frequency. It follows that modulated frequency can be measured and adjusted on a semiconductor wafer or after a semiconductor chip is fabricated. The measuring method also solves the circuit area and cost problems stated above.

The entire disclosure of Japanese patent application No. 2002-306485 filed on Oct. 22, 2002, including the specification, claims, accompanying drawings and abstract of the disclosure is incorporated herein by reference in its entirety.

While the present invention has been described with reference to the particular illustrative embodiment, it is not to be restricted by the embodiment. It is to be appreciated that those skilled in the art can change or modify the embodiment without departing from the scope and spirit of the present invention.

What is claimed is:

1. A frequency modulating device comprising:
   a frequency generator for generating a frequency-modulated first carrier;
   an input terminal for receiving a non-modulated second carrier;
   an amplifier for amplifying the second carrier;
   a frequency converter receiving the first carrier and the second carrier for producing a difference between the second carrier and the first carrier as an intermediate frequency signal,
   an output terminal for outputting the intermediate frequency signal;
   a frequency filter for limiting a frequency band of the intermediate frequency signal to output a band-limited signal;
   a calculator for calculating a spectrum distribution of the band-limited signal;
   a first selector included in said frequency generator for selectively feeding the first carrier to either one of said frequency converter and a transmitter system;
   a second selector for selectively feeding the second carrier to said frequency converter or feeding a signal output from the transmitter system to said input terminal; and
   a third selector included in the semiconductor device for selectively feeding the intermediate frequency signal output from said frequency converter to either one of said output terminal and a circuit configured to process said intermediate frequency signal,
   wherein said frequency generator, said input terminal, said amplifier, said frequency converter, said output terminal, said second selector, and said third seleetorare included in a semiconductor device constructed on a semiconductor wafer in the form of an integrated circuit.

2. The frequency modulating device in accordance with claim 1, wherein said frequency generator is included in a transmitter system of the semiconductor device for transmitting a signal from said device, and
   said frequency converter is included in a receiver system of the semiconductor device for receiving a signal.

3. The frequency modulating device in accordance with claim 2, wherein said frequency generator comprises:
   an oscillator for oscillating a local oscillation frequency signal;
   a frequency modulator for generating a frequency modulation signal in accordance with a setting of an AC amplitude, which is a signal for controlling a modulation frequency for frequency modulation; and
   a mixer for combining the local oscillation frequency signal with the frequency modulation signal.

4. The frequency modulating device in accordance with claim 2, wherein said calculator executes a Fourier transform with the band-limited signal to determine the spectrum distribution.

5. The frequency modulating device in accordance with claim 3, wherein said frequency modulator comprises:
   an AC amplitude generator for generating the AC amplitude as a voltage control signal; and
   a modulation frequency generator for generating the modulation frequency in accordance with the AC amplitude, and
   wherein said AC, amplitude generator comprises a plurality of resistors connected to a constant current source, which is included in said amplifier, in parallel for adjusting the AC amplitude, and a plurality of switches respectively connected to said plurality of resistors in parallel for selectively turning on or off said plurality of switches in response to switching control signals, which selectively turn on or off said plurality of resistors.

6. The device in accordance with claim 3, wherein said calculator executes a Fourier transform with the band-limited signal to determine the spectrum distribution.

7. The frequency modulating device in accordance with claim 5, wherein the second carrier is input from outside of the semiconductor device.

8. The frequency modulating device in accordance with claim 5, wherein said calculator executes a Fourier transform with the band-limited signal to determine the spectrum distribution.

9. The frequency modulating device in accordance with claim 7, wherein said calculator executes a Fourier transform with the band-limited signal to determine the spectrum distribution.

10. The frequency modulating device in accordance with claim 1, wherein said calculator executes a Fourier transform with the band-limited signal to determine the spectrum distribution.

11. A method of measuring a modulated frequency for a frequency modulating device, comprising:
- a first step of generating a frequency-modulated first carrier by using a semiconductor device constructed on a semiconductor wafer in a form of an integrated circuit;
- a second step of inputting a non-modulated second carrier from an outside of the semiconductor device;
- a third step of using the first carrier and the second carrier to generate a difference between the second carrier and the first carrier as an intermediate frequency signal obtained by a frequency conversion with said first carrier and said second carrier;
- a fourth step of limiting a frequency band of the intermediate frequency signal to output a band-limited signal; and
- a fifth step of calculating a spectrum distribution of the band-limited signal, wherein said second step comprises the substep of selecting the second carrier rather than a signal output from a transmitter system, and wherein said third step comprises the substep of outputting the intermediate frequency signal to an outside of the semiconductor device.

12. The method in accordance with claim 11, wherein said first step comprises the substep of combining a local oscillation frequency signal, which is generated by a transmitter system included in the semiconductor device for transmitting a signal, with a modulated signal resultant from frequency-modulating the local oscillation frequency signal to output the first carrier.

13. The method in accordance with claim 12, wherein said first step comprises:
- a sixth step of generating a voltage control signal matching with a frequency used for the frequency modulation of the local oscillation frequency signal as an AC amplitude;
- a seventh step of generating the modulated signal having the modulation frequency in accordance with the AC amplitude;
- an eighth step of combining the modulated signal with the local oscillation frequency signal to output the first carrier; and
- a ninth step of selecting a destination of the first carrier.

* * * * *